United States Patent
Liu et al.

(10) Patent No.: US 8,018,054 B2
(45) Date of Patent: Sep. 13, 2011

(54) SEMICONDUCTOR DIE PACKAGE INCLUDING MULTIPLE SEMICONDUCTOR DICE

(75) Inventors: Yong Liu, Scarborough, ME (US); Qiuxiao Qian, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 586 days.

(21) Appl. No.: 12/046,939

(22) Filed: Mar. 12, 2008

(65) Prior Publication Data

US 2009/0230536 A1    Sep. 17, 2009

(51) Int. Cl.
H01L 23/34    (2006.01)
(52) U.S. Cl. ........ 257/724; 257/723; 257/678; 257/672; 257/E23.178; 438/106; 438/121; 438/123
(58) Field of Classification Search .......... 257/690, 257/E23.178, 723, 724, 672, 676; 438/106, 438/121, 123
See application file for complete search history.

(56) References Cited

U.S. PATENT DOCUMENTS

| | | | |
|---|---|---|---|
| 4,731,701 A | 3/1988 | Kuo et al. | |
| 4,751,199 A | 6/1988 | Phy | |
| 4,772,935 A | 9/1988 | Lawler et al. | |
| 4,791,473 A | 12/1988 | Phy | |
| 4,796,080 A | 1/1989 | Phy | |
| 4,839,717 A | 6/1989 | Phy et al. | |
| 4,890,153 A | 12/1989 | Wu | |
| 5,327,325 A | 7/1994 | Nicewarner, Jr. et al. | |
| 5,532,910 A * | 7/1996 | Suzuki et al. | 361/813 |
| 5,646,446 A | 7/1997 | Nicewarner, Jr. et al. | |
| 5,776,797 A | 7/1998 | Nicewarner, Jr. et al. | |
| 6,133,634 A | 10/2000 | Joshi | |
| 6,329,706 B1 | 12/2001 | Nam | |
| 6,432,750 B2 | 8/2002 | Jeon et al. | |
| 6,489,678 B1 | 12/2002 | Joshi | |
| 6,495,908 B2 * | 12/2002 | Yang et al. | 257/676 |
| 6,556,750 B2 | 4/2003 | Constantino et al. | |
| 6,566,749 B1 | 5/2003 | Joshi et al. | |
| 6,574,107 B2 | 6/2003 | Jeon et al. | |
| 6,621,152 B2 | 9/2003 | Choi et al. | |
| 6,627,991 B1 | 9/2003 | Joshi | |
| 6,645,791 B2 | 11/2003 | Noquil et al. | |
| 6,674,157 B2 | 1/2004 | Lang | |
| 6,683,375 B2 | 1/2004 | Joshi et al. | |
| 6,696,321 B2 | 2/2004 | Joshi | |

(Continued)

OTHER PUBLICATIONS

Dixit, V et al., Wire Bonding Considerations Design Tips for Performance and Reliability, Jul. 2006, Advanced Packaging, vol. 15, issue 7.*

(Continued)

*Primary Examiner* — Marcos D. Pizarro
*Assistant Examiner* — Eva Yan Montalvo
(74) *Attorney, Agent, or Firm* — Kilpatrick Townsend & Stockton LLP (57) ABSTRACT

A semiconductor die package. The semiconductor die package includes a leadframe structure comprising a first die attach pad, and a second die attach pad laterally spaced from the first die attach pad, a first side and a second side opposite to the first side. The semiconductor die package further includes a first semiconductor die attached the first die attach pad at the first side of the leadframe structure, and a second semiconductor die attached to the second die attach pad at the second side of the leadframe structure. The semiconductor die package further includes a housing material covering at least a portion of the leadframe structure, the first semiconductor die, and the second semiconductor die.

16 Claims, 7 Drawing Sheets

U.S. PATENT DOCUMENTS

| | | | |
|---|---|---|---|
| 6,720,642 | B1 | 4/2004 | Joshi et al. |
| 6,731,003 | B2 | 5/2004 | Joshi et al. |
| 6,740,541 | B2 | 5/2004 | Joshi |
| 6,756,689 | B2 | 6/2004 | Nam et al. |
| 6,774,465 | B2 | 8/2004 | Lee et al. |
| 6,777,800 | B2 | 8/2004 | Madrid et al. |
| 6,806,580 | B2 | 10/2004 | Joshi et al. |
| 6,830,959 | B2 | 12/2004 | Estacio |
| 6,836,023 | B2 | 12/2004 | Joshi et al. |
| 6,867,481 | B2 | 3/2005 | Joshi et al. |
| 6,867,489 | B1 | 3/2005 | Estacio |
| 6,891,256 | B2 | 5/2005 | Joshi et al. |
| 6,891,257 | B2 | 5/2005 | Chong et al. |
| 6,893,901 | B2 | 5/2005 | Madrid |
| 6,943,434 | B2 | 9/2005 | Tangpuz et al. |
| 6,989,588 | B2 | 1/2006 | Quinones et al. |
| 6,992,384 | B2 | 1/2006 | Joshi |
| 7,022,548 | B2 | 4/2006 | Joshi et al. |
| 7,023,077 | B2 | 4/2006 | Madrid |
| 7,061,077 | B2 | 6/2006 | Joshi et al. |
| 7,061,080 | B2 | 6/2006 | Jeun et al. |
| 7,081,666 | B2 | 7/2006 | Joshi et al. |
| 7,122,884 | B2 | 10/2006 | Cabahug et al. |
| 7,154,168 | B2 | 12/2006 | Joshi et al. |
| 7,157,799 | B2 | 1/2007 | Noquil et al. |
| 7,196,313 | B2 | 3/2007 | Quinones et al. |
| 7,199,461 | B2 | 4/2007 | Son et al. |
| 7,208,819 | B2 | 4/2007 | Jeun et al. |
| 7,215,011 | B2 | 5/2007 | Joshi et al. |
| 7,217,594 | B2 | 5/2007 | Manatad |
| 7,242,076 | B2 | 7/2007 | Dolan |
| 7,256,479 | B2 | 8/2007 | Noquil et al. |
| 7,268,414 | B2 | 9/2007 | Choi et al. |
| 7,271,497 | B2 | 9/2007 | Joshi et al. |
| 7,285,849 | B2 | 10/2007 | Cruz et al. |
| 7,315,077 | B2 | 1/2008 | Choi et al. |
| 7,332,806 | B2 | 2/2008 | Joshi et al. |
| 2003/0075786 | A1* | 4/2003 | Joshi et al. .............. 257/676 |
| 2005/0145996 | A1* | 7/2005 | Luo et al. ................. 257/666 |
| 2007/0045785 | A1 | 3/2007 | Noquil |

OTHER PUBLICATIONS

U.S. Appl. No. 11/971,512, Liu, Yong.
U.S. Appl. No. 11/971,524, Liu, Yong.
U.S. Appl. No. 12/024,847, Liu, Yong.
U.S. Appl. No. 12/046,734, Liu, Yong.
U.S. Appl. No. 12/046,939, Liu, Yong.
U.S. Appl. No. 12/047,028, Liu, Yong.
U.S. Appl. No. 12/117,547, Liu, Yong.
On Semiconductor, "NCP360: USP Positive Overvoltage Protection Controller with Internal PMOS FET and Status FLAG," Dec. 2007, Pub No. NCP360/D Rev.3, Semiconductor Components Industries, LLC. (11 pages).
Fairchild Semiconductor, *Portable Solutions*, 2008 (35 pages).

\* cited by examiner

SEMICONDUCTOR DIE PACKAGE INCLUDING MULTIPLE SEMICONDUCTOR DICE

CROSS REFERENCE TO RELATED APPLICATIONS

This application is related to U.S. patent application Ser. No. 12/047,028, which is being filed on the same day as the present application, entitled "Semiconductor Die Package Including Embedded Flip Chip", and which is herein incorporated by reference in its entirety for all purposes.

BACKGROUND

Portable devices such as cell phones are proliferating. There is consequently a need for smaller semiconductor die packages with better heat dissipation properties.

One particular area where a small semiconductor die package would be useful is in a circuit, which provides over-voltage protection for a connection that includes D+/D− lines. One company, On Semi, produces a semiconductor die package which includes this function (a Vbus OVP function). However, it is a dual co-planar dice package. It does not have a D+/D− connectivity detection function in an offset dual dice package as in embodiments of the invention.

Embodiments of the invention address the above problems and other problems individually and collectively.

BRIEF SUMMARY

Embodiments of the invention are directed to semiconductor die packages and methods for making the same.

One embodiment of the invention is directed to a semiconductor die package. The semiconductor die package includes a leadframe structure comprising a first die attach pad, and a second die attach pad laterally spaced from the first die attach pad, a first side and a second side opposite to the first side. The semiconductor die package further includes a first semiconductor die attached the first die attach pad at the first side of the leadframe structure, and a second semiconductor die attached to the second die attach pad at the second side of the leadframe structure. The semiconductor die package further includes a housing material covering at least a portion of the leadframe structure, the first semiconductor die, and the second semiconductor die.

Another embodiment of the invention is directed to a method comprising obtaining a leadframe structure comprising a first die attach pad, and a second die attach pad laterally spaced from the first die attach pad, a first side and a second side opposite to the first side. The method also includes attaching a first semiconductor die to the first die attach pad at the first side of the leadframe structure, attaching a second semiconductor die to the second die attach pad at the second side of the leadframe structure, and forming a housing material over at least a portion of the leadframe structure, the first semiconductor die, and the second semiconductor die.

Other embodiments of the invention may be directed to electrical assemblies or circuits incorporating the above-described semiconductor die packages.

These and other embodiments of the invention are described in further detail below in the Detailed Description, with reference to the Figures.

BRIEF DESCRIPTION OF THE DRAWINGS

In the Figures, like numerals designate like elements, and the descriptions of some elements may not be repeated.

DETAILED DESCRIPTION

Embodiments of the invention are directed to a method of design for the electrical interconnection of an IC die and a leadframe structure. Other embodiments of the invention are directed to a method for mounting a MOSFET die and an IC die on opposite sides of a leadframe structure. In embodiments of the invention, heat dissipates at the top surface and at the bottom surface of the semiconductor die package.

Embodiments of the invention solve a number of problems. For example, embodiments of the invention can allow for offset and embedded dice in a semiconductor die package. The semiconductor die package can act as a switch for a cell phone system level application. It can combine an integrated circuit die, and a p-channel MOSFET flip chip die in a single semiconductor die package. It provides a power protection function for a Vbus pin, and over voltage protection with D+/D− connectivity detection.

Embodiments of the invention are different from a conventional co-planar dual die MLP (microlead package), as a flip chip MOSFET die and the integrated circuit or IC die are attached on opposite sides of a leadframe structure. Also, a semiconductor die package according to an embodiment of the invention can have a standard industry MLP (micro leadframe package) pin out. Further, in a semiconductor die package according to an embodiment of the invention, both top and bottom die attach paddles (DAPs) are exposed and provide for better thermal dissipation. An exposed MOSFET drain surface can also provide both an electrical connection pin (Vout) and thermal path to the external environment.

Figure 1:
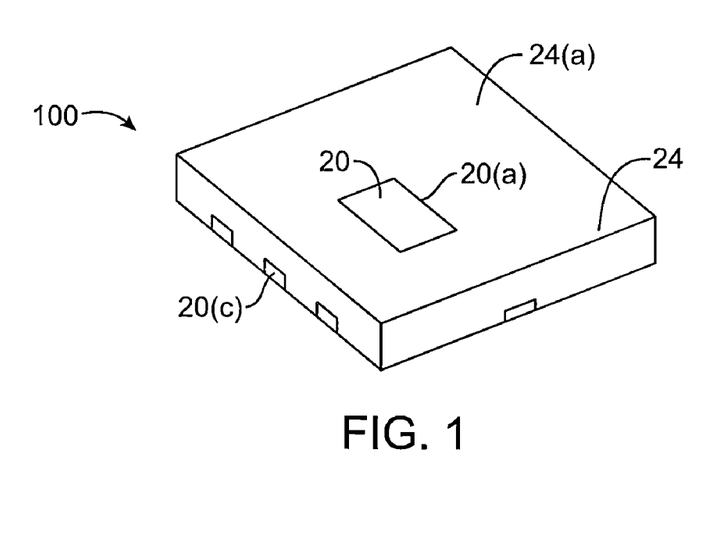
FIG. 1 shows a top perspective view of a semiconductor die package according to an embodiment of the invention.

FIG. 1 shows a top perspective view of a semiconductor die package 100 according to an embodiment of the invention. The semiconductor die package 100 comprises a molding material 24, which covers at least part of a leadframe structure 20. A surface 20(a) of the leadframe structure 20 is exposed through the molding material 24. The surface 20(a) may have been previously defined using a half or partial etching process or stamping process. The exterior surface 24(a) of the molding material 24 is substantially coplanar with the surface 20(a) of the leadframe structure. Leads 20(c) of the leadframe structure 20 are also shown in FIG. 1.

Figure 2:
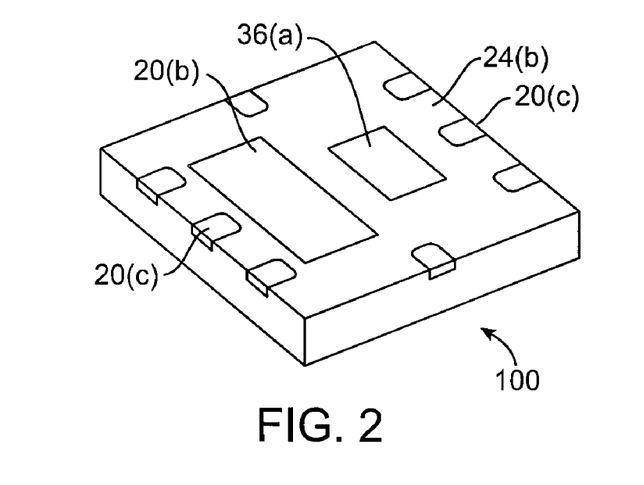
FIG. 2 shows a bottom perspective view of a semiconductor die package according to an embodiment of the invention.

FIG. 2 shows a bottom perspective view of the semiconductor die package 100 shown in FIG. 1. As shown, surfaces of leads 20(c), a surface 20(b) opposite a die attach pad, and a surface 36(a) of a second semiconductor die are exposed by the molding material 24 and are substantially coplanar with each other and also an exterior surface 24(b) of the molding material. The surfaces 20(b), 36(a), and surfaces of leads 20(c) may be connected to pads on a printed circuit board (not shown) using solder or some other suitable material.

The illustrated semiconductor die package 100 is an MLP (microleadframe package), which is also a molded leadless package. The leads 20(c) do not extend past lateral surfaces of the molding material 24. It may be referred to as a "leadless" package. In other embodiments, the leads may extend past the lateral surfaces of the molding material 24, and the semiconductor die package may be a leaded package.

Figure 3:
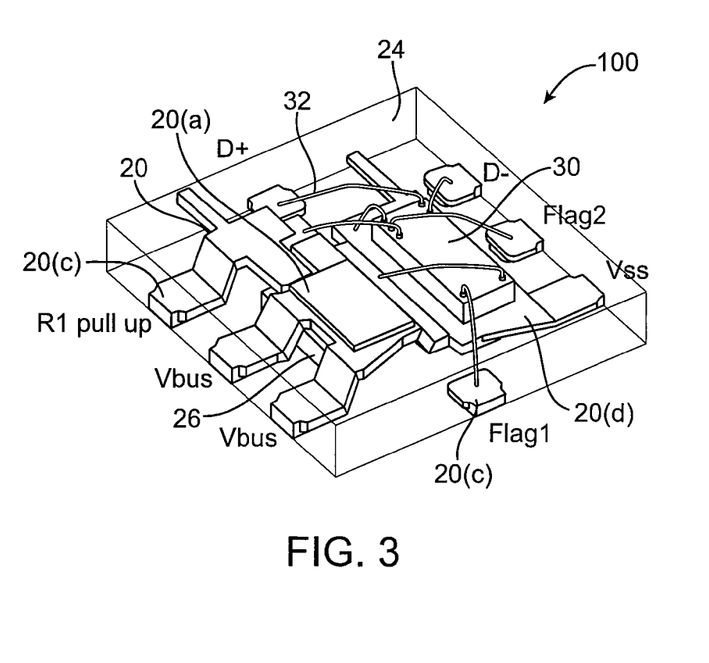
FIG. 3 shows a top perspective view of the semiconductor die package shown in FIG. 1, with the inside of the package being shown.
Figure 4:
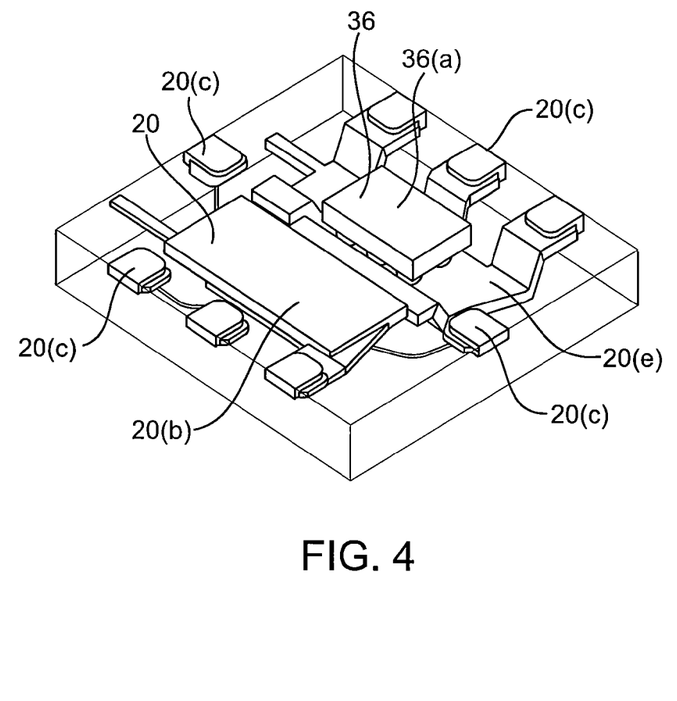
FIG. 4 shows a bottom perspective view of the semiconductor die package shown in FIG. 2, with the inside of the package being shown.

FIGS. 3-4 respectively show top and bottom perspective views of the semiconductor die package 100 shown in FIGS. 1-2, with the internal components being shown. The semiconductor die package 100 includes a leadframe structure 20 comprising a first die attach pad 20(d) and a second die attach pad 20(e) laterally spaced from the first die attach pad 20(d). The first die attach pad 20(d) is at a first side of the leadframe structure and the second die attach pad 20(e) is at a second side of the leadframe structure 20. The first side is opposite to the second side of the leadframe structure.

In the illustrated semiconductor die package 100, the first die attach pad 20(d) and the second die attach pad 20(e) are laterally spaced from the first die attach pad 20(d), and they lie in different planes. By doing so, the thickness of the formed semiconductor die package 100 can be minimized. In other embodiments, the first die attach pad 20(d) and the second die attach pad 20(e) may be coplanar.

The semiconductor die package 100 further includes a first semiconductor die 30 attached to the first die attach pad 20(d) at the first side of the leadframe structure 20, and a second semiconductor die 36 attached to the second die attach pad 20(e) at the second side of the leadframe structure 20. Wires 32 bond input and output regions in the first semiconductor die 30 to various leads 20(c) of the leadframe structure 20.

The semiconductor die package 100 further includes a housing material such as a molding material 24 covering at least a portion of the leadframe structure 20, the first semiconductor die 30, and the second semiconductor die 36. The molding material 24 may comprise an epoxy molding material.

The first semiconductor die 30 may comprises an integrated circuit die. An integrated circuit die comprises many electrical devices within a single die, and may be configured to perform control and/or detection functions. For example, the integrated circuit die may be configured to detect the presence of a USB device or a battery charger. An integrated circuit die can be compared to a discrete die, the latter of which may contain only one electrical device within the die.

The second semiconductor die 36 may include any suitable semiconductor device (such as a p-channel MOSFET die). Suitable devices may include vertical or horizontal devices. Vertical devices have at least an input at one side of the die and an output at the other side of the die so that current can flow vertically through the die. Horizontal devices include at least one input at one side of the die and at least one output at the same side of the die so that current flows horizontally through the die. Exemplary vertical power devices are also described in U.S. Pat. Nos. 6,274,905 and 6,351,018, both of which are assigned to the same assignee as the present application, and both of which are herein incorporated by reference in their entirety for all purposes.

Vertical power transistors include VDMOS transistors and vertical bipolar transistors. A VDMOS transistor is a MOSFET that has two or more semiconductor regions formed by diffusion. It has a source region, a drain region, and a gate. The device is vertical in that the source region and the drain region are at opposite surfaces of the semiconductor die. The gate may be a trenched gate structure or a planar gate structure, and is formed at the same surface as the source region. Trenched gate structures are preferred, since trenched gate structures are narrower and occupy less space than planar gate structures. During operation, the current flow from the source region to the drain region in a VDMOS device is substantially perpendicular to the die surfaces.

In the semiconductor die package illustrated in FIG. 3, the leads 20(c) can be designated as follows: Vbus (power input from charger, USB device, or handheld battery), D− (USB data input), D+ (USB data input), R1 (or alternatively LS ctrl or load switch control), Vss (device ground), Flag2 (over/under voltage flag), and Flag 1 (charger/USB device detect flag). The die surface 36(a) may form a Vout (output voltage) connection for the semiconductor die package 100. Since the Vout connection is at the bottom of the semiconductor die package 100, a lead can advantageously be saved and used for some other function.

Figure 5:
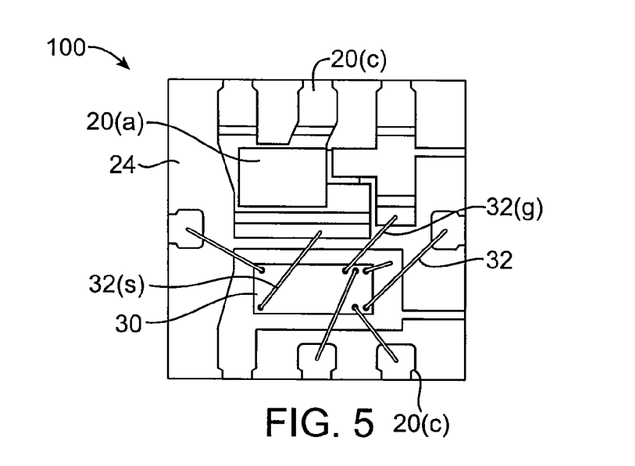
FIG. 5 shows a top plan view of the semiconductor die package shown in FIG. 1.
Figures 6, 8:
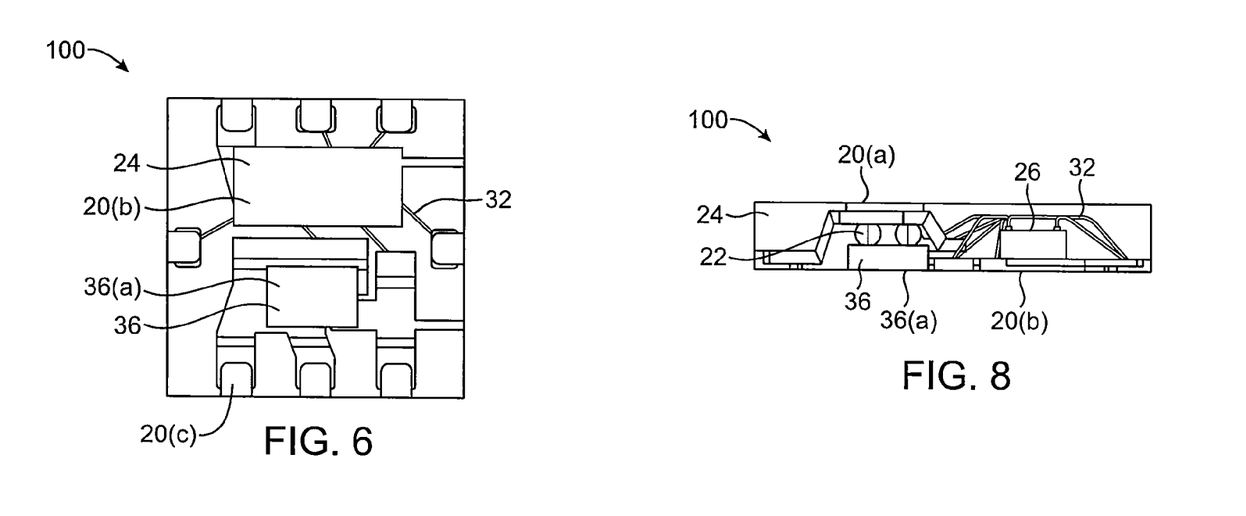
FIG. 6 shows a bottom plan view of the semiconductor die package shown in FIG. 2.
FIGS. 7-8 show side views of the semiconductor die package.
Figure 7:
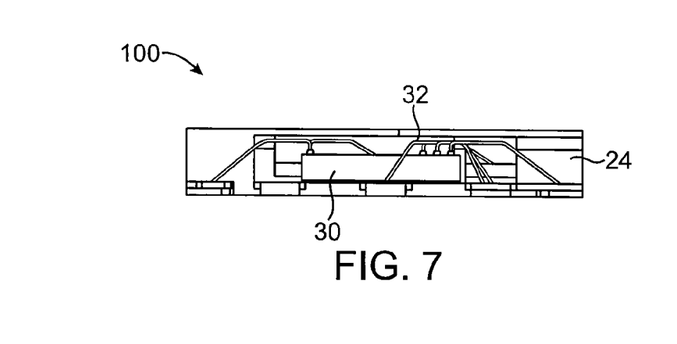

FIG. 5 shows a top plan view of the semiconductor die package shown in FIG. 1. FIG. 6 shows a bottom plan view of the semiconductor die package shown in FIG. 2. FIGS. 7-8 show side views of the semiconductor die package.

As shown in FIG. 5, a wire 32(g) may electrically couple the first semiconductor die 30 to a leadframe structure portion that is coupled to a gate region in the second semiconductor die 36. A second wire 32(s) may electrically couple the first semiconductor die 30 to another leadframe structure portion that is electrically coupled to a source region in the second semiconductor die 36. Thus, the first and second semiconductor dice 30, 36 may be electrically coupled to each other via bonding wires. In other embodiments, conductive clips could be used instead of bonding wires.

As shown in FIG. 8, the surfaces 20(a), 20(b), and 36(a) are exposed through the molding material 24. Heat can dissipate from the dice 26, 36 through these exposed surfaces. Also, since there is no molding material covering the surfaces 20(a), 20(b), 36(a), the semiconductor die package 100 is quite thin.

Another embodiment of the invention is directed to a method comprising obtaining a leadframe structure comprising a first die attach pad, and a second die attach pad laterally spaced from the first die attach pad, a first side and a second side opposite to the first side. The method also includes attaching a first semiconductor die to the first die attach pad at the first side of the leadframe structure, attaching a second semiconductor die to the second die attach pad at the second side of the leadframe structure, and forming a housing material over at least a portion of the leadframe structure, the first semiconductor die, and the second semiconductor die.

Figure 9A:
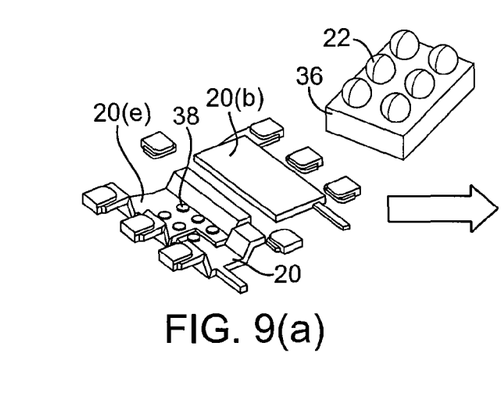
FIGS. 9(a)-9(g) show precursors that are formed during a process of forming a semiconductor die package.

Referring to FIG. 9(a), a leadframe structure 20 can first be obtained. The leadframe structure 20 can be commercially obtained or can be obtained by manufacturing it.

The term "leadframe structure" can refer to a structure that is derived from or is the same as a leadframe. Each leadframe structure can include two or more leads with lead surfaces and a die attach region. The leads extend laterally from the die attach region. A single lead frame structure may include a gate lead structure, and a source lead structure.

The leadframe structure may comprise any suitable material. Exemplary leadframe structure materials include metals such as copper, aluminum, etc., and alloys thereof. The leadframe structures may also include plated layers such as plated layers of gold, chromium, silver, palladium, nickel, etc. The leadframe structure may also have any suitable thickness, including a thickness less than about 1 mm (e.g., less than about 0.3 mm).

The leadframe structure can be stamped, etched and/or patterned using conventional processes to shape the leads or other portions of the leadframe structure. For example, the leadframe structure can be formed by stamping, or by etching a continuous conductive sheet to form a predetermined pattern. Before or after etching, the leadframe structure can also be optionally stamped so that a die attach surface of the leadframe structure is downset with respect to the lead surfaces of the leads of the leadframe structure. If stamping is used, the leadframe structure may be one of many leadframe structures in an array of leadframe structures that are connected by tie-bars. The leadframe structure array may also be cut to separate the leadframe structures from other leadframes structures (Normally, after molding). As a result of cutting, portions of a leadframe structure in a final semiconductor die package such as a source lead and a gate lead may be electrically and mechanically uncoupled from each other. Thus, a leadframe structure may be a continuous metallic structure or a discontinuous metallic structure.

Figure 9B:
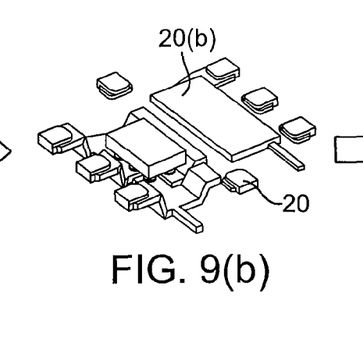

Referring to FIGS. 9(a)-9(b), a second semiconductor die 36 can then be attached to a second die attach pad 20(e) of the leadframe structure 20. Solder or some other conductive adhesive 38 may be on the second die attach pad 20(e). The second die attach pad 20(e) may have source and lead die attach pad portions, which may eventually be coupled to source and gate regions in the second semiconductor die 36. In addition, conductive bumps 22 (e.g., solder bumps) may be on the second semiconductor die 36. The conductive bumps 22 may include at least one gate bump and at least one source bump, and may contact the conductive adhesive 38 when the second semiconductor die 36 is mounted on the leadframe structure 20.

Referring to FIG. 9(b), the second semiconductor die 36 and its conductive bumps 22 may be flipped over and mounted to the second die attach pad 20(e). Then, as shown in FIG. 9(c), the entire assembly may be flipped over.

Figures 9C, 9D:
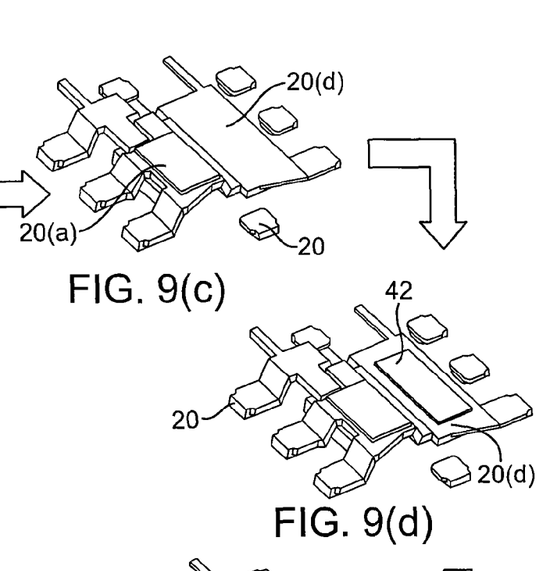
Figure 9E:
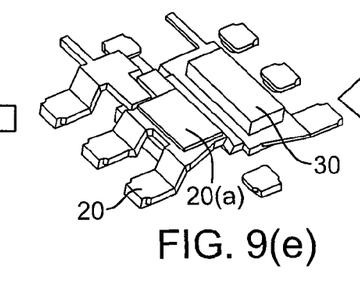

Referring to FIG. 9(d), a conductive adhesive 42 (e.g., solder) may be placed on the first die attach pad 20(d) of the leadframe structure 20. Then, as shown in FIG. 9(e), the first semiconductor die 30 can be attached to the first die attach pad 20(e).

Figure 9F:
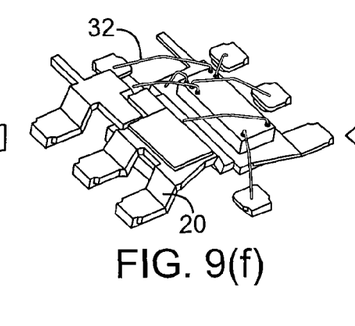

As shown in FIG. 9(f), wirebonds 32 can then be formed between the leads 20(c) and the first semiconductor die 30. The wirebonds 32 may comprise a material such as gold or copper. Known wirebonding processes can be used.

Figure 9G:
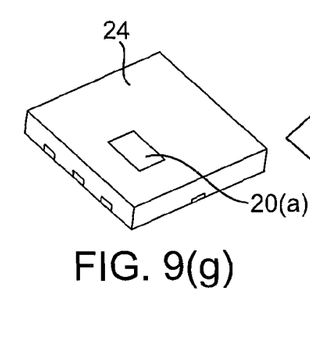

Referring to FIG. 9(g), a molding material 24 is then formed over the leadframe structure 20 and the first and second semiconductor dice 30, 36. The molding material 24 may be formed of a material such as epoxy. Known molding processes (e.g., a tape assisted molding process) may be used to mold the molding material 24.

Figure 10:
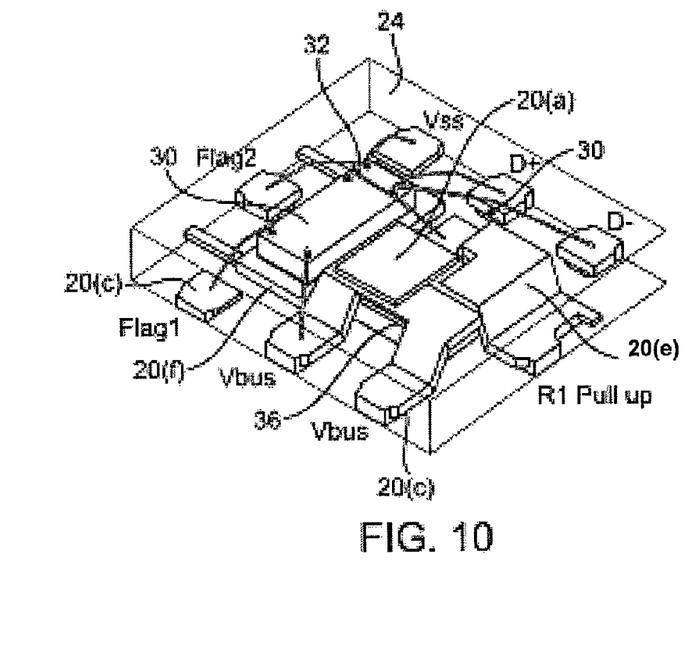
FIG. 10 shows a top perspective view of another semiconductor die package embodiment.
Figure 11:
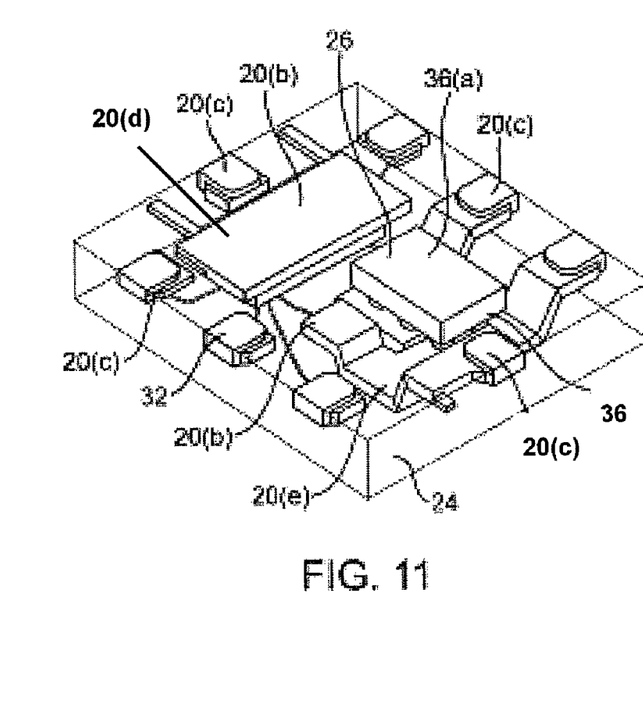
FIG. 11 shows a bottom perspective view of another semiconductor die package embodiment.

FIG. 10 shows a top perspective view of another semiconductor die package embodiment. FIG. 11 shows a bottom perspective view of the semiconductor die package shown in FIG. 10. The leads in the semiconductor die package shown in FIGS. 10-11 are different than in the semiconductor die package illustrated in FIG. 3.

Figure 12:
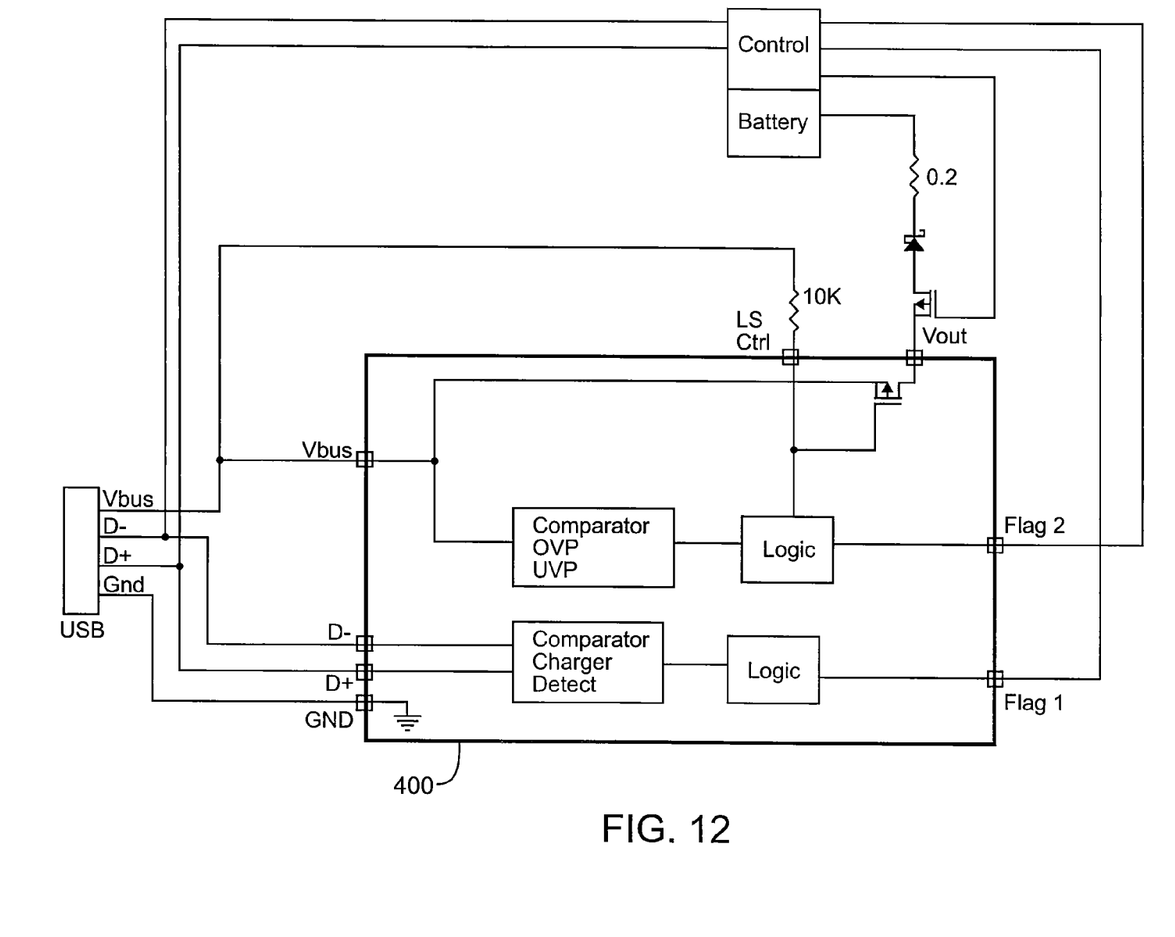
FIGS. 12-13 show circuit diagrams.

FIG. 12 shows a circuit diagram that can be associated with the previously described package. The device 400 may include Vbus over-voltage protection (OVP) and D+/D− connectivity detection in a single package. The device 400 may be a USB connection monitoring device that is used to determine if a standard USB device is connected or a battery charging device is connected. In operation, the device 100 can set the Flag 1 lead to a logic high or low as an indicator to the system controller that a standard USB device or a charger is connected to the USB port. It also monitors Vbus for an over or under voltage condition. The Flag 2 lead can be set low if a condition exists where the Vbus lead is less than 3.3V or greater than 6.0V. The LS (load switch) Control (LS Ctrl) lead can be set high if a condition exists where the Vbus lead is less than 3.3V or greater than 6.0V turning off the PMOS switch.

The terminal connections in device 400 can be as follows in an exemplary embodiment: Vbus (power connection from a charger or other external power source); D− input (USB data input); D+ input (USB data input); Gnd (device ground pin); Flag 2 (indicates if Vbus is out of voltage range (e.g., 3.3V-6V)); Flag 1 (indicates if D− and D+ are shorted; low: standard USB device; high: charger; standard output drive H=2.5V, L=0.8V).

Figure 13:
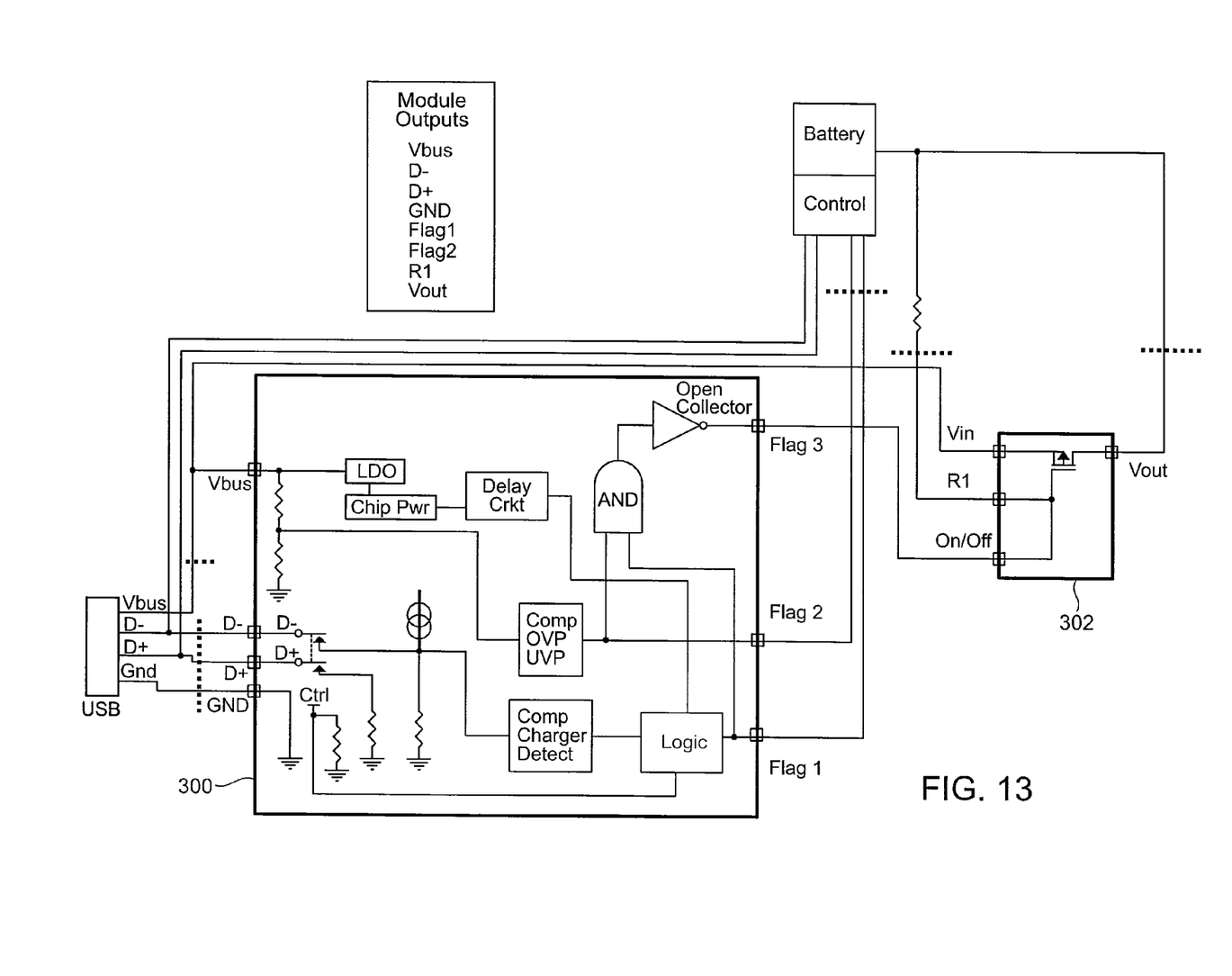

FIG. 13 shows another circuit diagram that can be associated with the previously described package. FIG. 13 shows an integrated circuit die 300 electrically coupled to a power transistor die 302. The discrete device die 302 can be a P-channel power MOSFET die. The integrated circuit die 300 can be a USB connection monitoring device that is used to determine if a standard USB device is connected or if a battery charging device is connected. Features of the integrated circuit die 300 may include over/under voltage detection, charger/USB device detection, and may work with a Vbus supply voltage of 2.7V to 6V. In FIG. 13, dotted lines may show where package lead connections can be provided.

Although specific circuits are shown in FIGS. 12-13, embodiments of the invention are not limited thereto. For example, a semiconductor die package according to an embodiment of the invention could use a first semiconductor die that is a power MOSFET and a second semiconductor die that is an integrated circuit die with a control function. The package could be used in a power circuit, but need not be used to detect the presence of a USB device.

The terms and expressions which have been employed herein are used as terms of description and not of limitation, and there is no intention in the use of such terms and expressions of excluding equivalents of the features shown and described, or portions thereof, it being recognized that various modifications are possible within the scope of the invention claimed. Moreover, any one or more features of any embodiment of the invention may be combined with any one or more other features of any other embodiment of the invention, without departing from the scope of the invention. For example, although a semiconductor die package with two dice is shown, other embodiments of the invention may include more than two semiconductor dice within a single semiconductor die package.

All patent applications, patents and publications noted above are herein incorporated by reference in their entirety for all purposes. None is admitted to be prior art.

As used herein, the terms "a", "an" or "the" are intended to mean "one or more" unless indicated to the contrary.

Terms such as "top", "bottom", etc. are used to refer to positions of various components in the Figures. Such terms may or may not refer to the positions of such components in actual devices or packages.

What is claimed is:

1. A semiconductor die package comprising:
a leadframe structure comprising a first die attach pad, and a second die attach pad laterally spaced from the first die attach pad, a first side and a second side opposite to the first side;
a first semiconductor die attached the first die attach pad at the first side of the leadframe structure;

a second semiconductor die attached to the second die attach pad at the second side of the leadframe structure; and a housing material covering at least a portion of the leadframe structure, the first semiconductor die, and the second semiconductor die, wherein the first die attach pad and the second die attach pad lie in different planes, and wherein the semiconductor die package is an MLP type package.

2. The semiconductor die package of claim 1 wherein the first semiconductor die is an integrated circuit die, and the second semiconductor die is a power transistor die.

3. The semiconductor die package die package of claim 1 wherein the housing material is a molding material.

4. The semiconductor die package of claim 1 wherein the second semiconductor die comprises a die surface, and wherein the molding material comprises an exterior surface, wherein the die surface is substantially coplanar with the exterior surface of the molding material.

5. The semiconductor die package of claim 1 further comprising a plurality of solder structures disposed between the second semiconductor die and the leadframe structure.

6. The semiconductor die package of claim 1 wherein the first semiconductor die is configured to detect a USB device.

7. The semiconductor die package of claim 1 wherein the leadframe structure is plated.

8. The semiconductor die package of claim 1 wherein the semiconductor die package is configured to provide overvoltage protection and USB detection functions.

9. The semiconductor die package of claim 1 wherein the first and second semiconductor dies are laterally spaced from each other and are at opposite sides of the leadframe structure.

10. The semiconductor die package of claim 1 wherein the first and second sides correspond to major surfaces of the leadframe structure.

11. A method comprising:

obtaining a leadframe structure comprising a first die attach pad, and a second die attach pad laterally spaced from the first die attach pad, a first side and a second side opposite to the first side;

attaching a first semiconductor die to the first die attach pad at the first side of the leadframe structure;

attaching a second semiconductor die to the second die attach pad at the second side of the leadframe structure; and forming a housing material over at least a portion of the leadframe structure, the first semiconductor die, and the second semiconductor die, wherein the first die attach pad and the second die attach pad lie in different planes, and wherein the semiconductor die package is an MLP type package.

12. The method of claim 11 wherein the first semiconductor die is a integrated circuit die, and the second semiconductor die is a power transistor.

13. The method of claim 11 wherein the housing material is a molding material.

14. The method of claim 11 wherein the second semiconductor die comprises a die surface, and wherein the molding material comprises an exterior surface, wherein the die surface is substantially coplanar with the exterior surface of the molding material.

15. The method of claim 11 further comprising a plurality of solder structures disposed between the second semiconductor die and the leadframe structure.

16. The method of claim 11 wherein the first semiconductor die is configured to detect a USB device.

* * * * *